(12) United States Patent
Onclin et al.

(10) Patent No.: US 8,426,484 B2
(45) Date of Patent: Apr. 23, 2013

(54) LIQUID PHOTOINITIATOR BLEND

(75) Inventors: Steffen Onclin, Neustadt an der Weinstrasse (DE); Svetozar Lucic, Kaisten (CH); Karin Powell, Lörrach (DE); Wolfgang Peter, Altlubheim (DE); Frank Oliver Heinrich Pirrung, Grünstadt (DE); Clemens Auschra, Freiburg (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/144,294

(22) PCT Filed: Jan. 4, 2010

(86) PCT No.: PCT/EP2010/050003
§ 371 (c)(1),
(2), (4) Date: Sep. 28, 2011

(87) PCT Pub. No.: WO2010/081749
PCT Pub. Date: Jul. 22, 2010

(65) Prior Publication Data
US 2012/0035292 A1    Feb. 9, 2012

(30) Foreign Application Priority Data
Jan. 14, 2009 (EP) .................................. 09150509

(51) Int. Cl.
| | | |
|---|---|---|
| *A61L 2/08* | (2006.01) | |
| *B41M 7/00* | (2006.01) | |
| *B29C 71/04* | (2006.01) | |
| *C08F 2/46* | (2006.01) | |
| *C08J 3/28* | (2006.01) | |
| *H05B 6/68* | (2006.01) | |
| *C08G 61/04* | (2006.01) | |

(52) U.S. Cl.
USPC ...... 522/79; 522/74; 522/71; 522/1; 522/189; 520/1

(58) Field of Classification Search ............... 522/79, 522/74, 71, 1, 189; 520/1
See application file for complete search history.

(56) References Cited

U.S. PATENT DOCUMENTS

| | | | |
|---|---|---|---|
| 4,186,108 A | 1/1980 | Carlson et al. | |
| 4,965,294 A | 10/1990 | Ohngemach et al. | |
| 6,518,326 B1 * | 2/2003 | Nesvadba et al. | 522/12 |
| 2009/0041937 A1 * | 2/2009 | Leenders et al. | 427/256 |
| 2010/0119858 A1 | 5/2010 | Benkhoff et al. | |
| 2011/0040018 A1 | 2/2011 | Moeck et al. | |
| 2011/0166284 A1 | 7/2011 | Hu et al. | |

FOREIGN PATENT DOCUMENTS
GB    2014152 A    8/1979

OTHER PUBLICATIONS

Copending U.S. Appl. No. 13/130,796, filed May 24, 2011.

* cited by examiner

*Primary Examiner* — Ling Choi
*Assistant Examiner* — Jessica E Whiteley
(74) *Attorney, Agent, or Firm* — Shruti Costales

(57) ABSTRACT

The present invention relates to a homogenous liquid blend comprising a photoinitiator and an alkoxylate surfactant for incorporation into aqueous based and solvent based radiation curable systems. In particular the invention relates to a homogenous liquid blend which is liquid at room temperature comprising at least 30% by weight with regard to the whole blend of a solid photoinitiator of the radical type and 1-70% by weight of at least one alkoxylated liquid surface active agent and optionally an organic diluent.

10 Claims, No Drawings

LIQUID PHOTOINITIATOR BLEND

The present invention relates to a homogenous liquid blend comprising a photoinitiator and an alkoxylate surfactant for incorporation into aqueous based and solvent based radiation curable systems.

A potential problem is that many photoinitiators are solid at room temperature and have to be dissolved before incorporating them into coating formulations. Solubilizing solid photo-initiators into the coating formulation may require excess or additional diluents that could adversely affect the properties of the coating or may be undesirable from environmental aspects. Moreover, the use of solid photoinitiators often results in processing disadvantages during manufacture of UV-curable paints. They often require longer times of mixing until a uniform distribution and dissolution has been achieved. In addition, especially with water-borne UV-curable paints, it is also very difficult to control the status of homogeneous dissolution as the paint formulation is in itself turbid. These problems lead to higher processing effort and less reproducible quality. Therefore liquid photoinitiators are preferred for producing of UV-curable paints. Other options include dissolving the photoinitiators in the reactive diluent, dissolving a solid photoinitiator in a liquid one, and dissolving the photo-initiators in nontoxic, nonvolatile solvents that do not adversely affect coating properties.

U.S. Pat. No. 4,609,612 (Ciba) addresses the problem of mixing benzoylcyclohexanol which is a crystalline compound melting at 50° C. into oily-liquid or pasty photopolymerisable compositions. The problem is solved by mixing the 1-benzoylcyclohexanol with equal parts of benzophenone which melts below 80° C. These mixtures are liquid within a certain mixing range, and can therefore be quickly incorporated in a simple manner into liquid or pasty compositions. This solution is not suitable for aqueous systems.

The European Patent EP1230276B1 (Ciba) relates to aqueous suspensions of bis(2,4,6-trimethylbenzoyl)-phenylphosphine oxide (IRGACURE® 819). A dispersing agent is dissolved in water and the photoinitiator is added at room temperature. The suspension obtained is then treated in a colloid mill to obtain particles in the range of 0.1-12 µm.

The European Patent EP386650 (Lamberti) discloses an aqueous dispersion comprising a photoinitiator and a surfactant. The photoinitiator is present from 30 to 60% by weight of the disperse system. The surfactant is e.g. a reaction product of a higher aliphatic alcohol with ethylene oxide and propylene oxide. At first a homogeneous solution is prepared by adding the photoinitiator at elevated temperatures to the surfactant. To the homogeneous solution water is added. The solution thus cools down and solidifies. A dispersion (solid particles) of the photoinitiator is obtained. The dispersion is grinded. As an aqueous dispersion there still remain disadvantages in that the photoinitiator particles may settle on prolonged storage and that the aqueous dispersion is incompatible to many non-aqueous UV-systems.

UK Patent Application GB 2014152 describes a blend comprising a triarylsulphonium complex salt photoinitiator dissolved in an alkoxylated liquid surface active agent to form liquid solutions in which the complex salt is at a concentration of at least 5% by weight and may be as high as 30% by weight. Higher concentrations of the photoinitiator are not disclosed.

The problem underlying the present invention is to provide a liquid photoinitiator blend which remains liquid and homogeneous (i.e. no formation of a dispersion) at room temperature and which has a high active content of photoinitiator, preferably more than 30% by weight. Said blend should be suitable for aqueous based and solvent based radiation curable systems.

It has now been found that mixing a photoinitiator of the radical type with a liquid surface active agent, and optionally with an organic diluent leads to a homogenous liquid blend with a high content of photoinitiator and which is stable at room temperature.

Thus, the invention relates to a homogenous liquid blend which is liquid at room temperature comprising at least 30% by weight with regard to the whole blend of a solid photoinitiator of the radical type and 1-70% by weight of at least one alkoxylated liquid surface active agent and optionally an organic diluent. (Claim 1)

Compared to the dispersed photoinitiator of EP386650 (Lamberti) which is a heterogeneous system the present invention is a homogeneous system at room temperature. Lamberti requires water to obtain a heterogeneous product form at room temperature. Also high energy input is required to prepare the product form (dispersing process).

DEFINITIONS

The term "homogenous liquid blend" generally describes a substance in a liquid phase, without the presence of a secondary droplet or particle phase that could separate. The liquid blend has at room temperature a viscosity not higher than 30000 mPas and therefore can be processed as a liquid with standard technical equipment for pumping and mixing of liquid materials.

The alkoxylated surface active agent is responsible for the emulsifying properties and for providing compatibility of the resulting photoinitiator additive concentrate towards aqueous and non-aqueous formulations like paint or ink formulations. Preferably, the pure surfactant is a liquid at room temperature.

The term "alkoxylated liquid surface active agent" is understood to include different types of non-ionic compounds of surface active agents selected from alkoxylated compounds based on adducts of ethylene oxide and/or propylene oxide. (claim 3)

The term "alkoxylated liquid surface active agent" refers to compounds in which one or more straight or branched $C_1$-$C_{22}$ alkyl chains are connected through the residue of a linking group to an oligomeric or polymeric chain of alkylene oxide residues. The term also refers to compounds in which one or more aromatic groups, which can be alkylated, are connected through the residue of a linking group to an oligomeric or polymeric chain of alkylene oxide residues. The term also refers to compounds containing one or more acetylenic groups, which can be connected through the residue of a linking group to one or two oligomeric or polymeric chains of alkylene oxide residues. The term also refers to block-copolymers or random copolymers of ethylene oxide and propylene oxide. The linking group can be an oxygen atom (hydroxyl group residue from alcohol or phenol); a carboxyl group (fatty acid or ester residue); an amino group (amine group residue); or a carboxyamido (carboxylic amide residue). The alkylene oxide residues are typically residues of ethylene oxide —$CH_2$—$CH_2$—O— or propylene oxide —$CH_2$—$CH_2$—$CH_2$—O—, (—$CH(CH_3)$—$CH_2$—O) or combinations of ethylene and propylene oxide residues.

The surface active agent is thus selected from alcohol alkoxylates (glycol ethers), fatty acid alkoxylates, fatty amine alkoxylates, or fatty amide alkoxylates, alkoxylates of phenols or alkylsubstituted phenols, block copolymers or random copolymers of ethylene oxide and propylene oxide, alkoxylates of alkine-alcohols or alkine-diols, alkoxylates of castor oil, alkoxylates of sorbitan fatty acid esters and mixtures thereof. (Claim 4)

Examples of suitable alkoxylated surface active agents include:

alcohol alkoxylates(glycolethers), of the formula $C_1$-$C_{22}$alkyl-O-(AO)$_n$—H or $C_1$-$C_{22}$alkyl-O-(AO)$_n$—$C_1$-$C_6$alkyl;

fatty acid alkoxylates of the formula $C_1$-$C_{22}$alkyl-COO-(AO)n-H or formula $C_1$-$C_{22}$alkyl-COO-(AO)n-$C_1$-$C_6$alkyl;

fatty amine alkoxylates of the formula $C_1$-$C_{22}$alkyl-NR$_a$-(AO)n-H; $C_1$-$C_{22}$alkyl-NR$_a$-(AO)n-$C_1$-$C_6$alkyl;

or fatty amide alkoxylates of the formula $C_1$-$C_{22}$alkyl-CO—NR$_a$-(AO)n-H; $C_1$-$C_{22}$alkyl-CO—NR$_a$-(AO)n-$C_1$-$C_6$alkyl;

wherein R$_a$ is $C_1$-$C_6$alkyl or a group -(AO)n-H and each AO is independently an ethylene oxide or propylene oxide, and the total of the indices n in the molecule is preferably in the range from 2 to 80, more preferably 3 to 40;

alkoxylates of phenols or alkylsubstituted phenols;

block copolymers or random copolymers of ethylenoxide and propylene oxide;

alkoxylates of alkine-alcohols or alkine-diols;

alkoxylates of castor oil;

alkoxylates of sorbitan fatty acid ester.

The $C_1$-$C_{22}$alkyl group in the above mentioned alkoxylates is linear or branched, saturated or unsaturated and preferably $C_6$-$C_{20}$.

Examples of suitable alkoxylated liquid surface active agents include also compounds in which a straight or branched $C_1$-$C_{22}$ alkyl chain is connected through the residue of a linking group as defined above to multifunctional alcohols like trimethylolpropane, sugar derivatives like sorbitan esters, triglycerides like castor oil and the like.

Preferred are non-ionic surfactants having a poly(alkylene oxide) group, such as a poly-(ethylene oxide) group or a poly(propylene oxide) group or mixtures thereof.

Examples are compounds sold under the Trade Mark Brij (such as polyoxyethylene (4) lauryl ether (Brij 30) or polyoxyethylene (20) cetyl ether (Brij 58), polyoxyethylene (20) stearyl ether (Brij 78) and polyoxyethylene (20) oleyl ether (Brij 92) or polyethylene glycol monomethyl ether (MPEG). Other examples are adducts to C13-oxoalcohols like C13-oxoalcohol+3 EO (Lutensol TO 3), C13-oxoalcohol+7 EO (Lutensol TO 7), or adduct to C10-oxoalcohols like C10-oxoalcohol+6 EO (Lutensol ON 60).

Also preferred are non-ionic surfactants derived from ethoxylated esters of fatty acids with glycerine or sorbitan, such as polyoxyethylene glycerine monostearate, polyoxyethylene sorbitan monolaurate, polyoxyethylene sorbitan monopalmitate, polyoxyethylene sorbitan-monostearate, polyoxyethylene sorbitan monooleate, polyoxyethylene sorbitan tristearate, polyoxyethylene sorbitan trioleate.

The sorbitan esters are sold under the tradename Tween, like polyoxyethylene (20) sorbitan monolaurate (Tween 20), polyoxyethylene (20) sorbitan monopalmitate (Tween 40), polyoxyethylene (20) sorbitan monostearate (Tween 60), polyoxyethylene (20) sorbitan tristearate (Tween 65), polyoxyethylene (20) sorbitan monooleate (Tween 80), polyoxyethylene (20) sorbitan trioleate (Tween 85).

Examples of suitable alkoxylated fatty acids are: Diethylene glycol mono-oleate (Radiasurf 7400), PEG-400 monolaurate (Radiasurf 7423), PEG-600 dioleate (Radiasurf 7444), Examples of suitable fattyamine alkoxylates are adducts of laurylamin with 5 EO (Lutensol FA 5 K), adducts of laurylamin with 10 EO (Lutensol FA 10 K), Examples of suitable alkoxylated fattyamides are adducts of oleic acidamide and 10 EO (Lutensol FSA 10) or the adduct of oleic acid monoethanolamide with 3 EO (Serdolamide NXC 3 H)

Examples for alkoxylated phenols are adducts of nonylphenol with 3 EO (Marlophen NP 3), adduct of nonylphenol with 10 EO (Marlophen NP 10), or alkylenoxide adducts of tristyrylphenol.

Examples of block copolymers of ethylenoxide and propylene oxide are the products sold under the Pluronics trademark like: Pluronics 3100, Pluronics 3500, Pluronics 4200, Pluronics 6400 or Tetronic RED 9040 (EO-PO block copolymer adduct to ethylene diamine)

Examples of alkoxylates of alkine-alcohols or alkine-diols are product sold under the Trademarks: Surfynol (like Surfynol 104, Surynol 420, Surfynol 440, Surfynol 465 and Surfynol 2502)

Also preferred are non-ionic surfactants derived from ethoxylates of vegetable oils or animal fats, such as corn oil ethoxylate, castor oil ethoxylate, tallow oil ethoxylate.

An example for a castor oil ethoxylates is one marked under the trademark Hedipin.

The surfactant can be a blend of all classes of alkoxylated surface active substances described previously.

Optionally one or more organic diluents may be present.

The optional organic diluent provides additional stability of the photoinitiator concentrate and assists in improving compatibility of the photoinitiator concentrate towards different end use formulations.

The optional organic diluent is chosen from the group consisting of high boiling inert liquids based on ester and or ether compounds like: oligo ethylene glycols, adipates, phthalates, alkyl esters, aromatic esters, diesters, etc. Also suitable are high boiling liquid alcohols like C10 to C20-alcohols or polyols. More preferably the organic diluent has a boiling point above 120° C., most preferred above 160° C.

Examples of oligoethylene glycols include: triethylene glycol, tetraethylene glycol or tripropylene glycol or tetrapropylene glycol or methoxypolyethylene glycols of different molecular weights. Examples of organic diluents based on ester fluids include: dioctyl adipate, dibutyladipate, benzyl benzoate, dimethyl phthalate, dibutylphthalate, fatty acid methylesters, fatty acid ethylhexylesters, citric acid triethylester.

Examples of ether fluids are diethylene glycol dibutyl ether and phenoxyethanol

Examples of alcohols are isodecanol, C12-C15 oxoalcohols, propylene glycol, dipropylene glycol, tripropylene glycol, oligoethylene glycols like diethylene glycol, triethylene glycol, tetraethylene glycol and glycerin In one embodiment the organic diluent is present. (claim 5)

The amount of organic diluent in the inventive liquid blend is typically less than 60% by weight, preferably less than 40% and most preferably less than 25%.

Optionally the blend may contain water. Small amounts of water may not have a negative impact concerning the stability of the inventive photoinitiator blends as well as concerning the compatibility of the inventive photoinitiator blends for non-aqueous systems.

The amount of water in the inventive liquid blend is typically less than 10% by weight, preferably less than 5% and most preferable less than 2% or water-free.

Photoinitiators

The photoinitiator is of the radical type. The photoinitiator is solid at room temperature.

In one embodiment the photoinitiator is selected from benzophenones, aromatic α-hydroxyketones, benzilketals, aromatic α-aminoketones, phenylglyoxalic acid esters, mono-acylphosphinoxides, bis-acylphosphinoxides, tris-acylphosphinoxides and/or oximesters derived from aromatic ketones. (claim 6)

Examples of photoinitiators are camphor quinone; benzophenone, benzophenone derivatives, such as 2,4,6-trimethylbenzophenone, 2-methylbenzophenone, 3-methylbenzophenone, 4-methylbenzophenone, 2-methoxycarbonylbenzophenone 4,4'-bis(chloromethyl)-benzophenone, 4-chlorobenzophenone, 4-phenylbenzophenone, 3,3'-dimethyl-4-methoxy-benzophenone, [4-(4-methylphenylthio)phenyl]-phenylmethanone, methyl-2-benzoylbenzoate, 3-methyl-4'-phenylbenzophenone, 2,4,6-trimethyl-4'-phenylbenzophenone, 4,4'-bis(dimethylamino) benzophenone, 4,4'-bis(diethylamino)benzophenone,

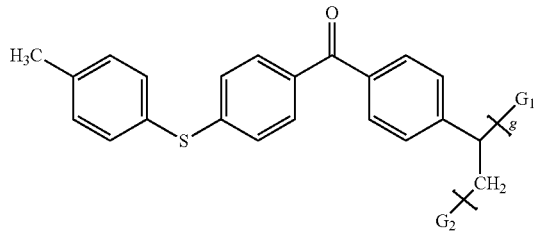

with g=about 12 (Speedcure® 7003, provided by Lambson);

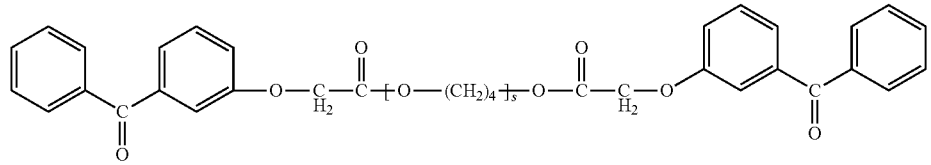

with s=1-20 (Omnipol BP), a mixture of

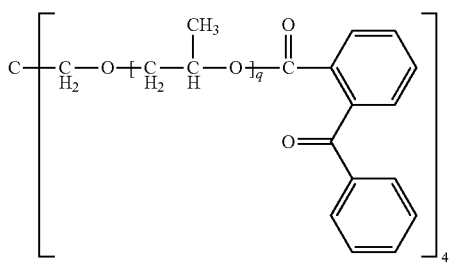

with q=about 2 and

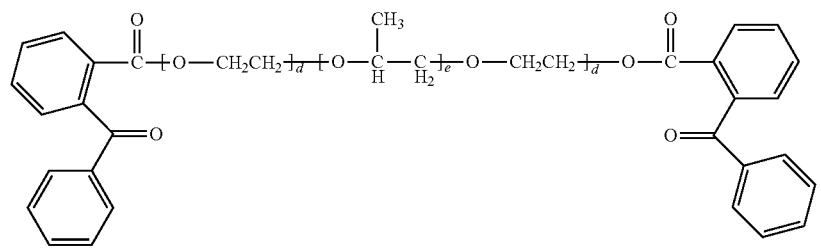

wherein the sum of d and e is about 14, where d is greater than e (Speedcure® 7005, provided by Lambson),

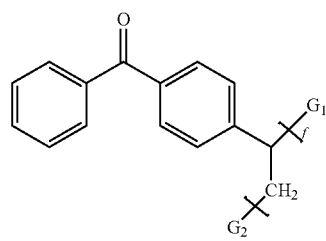

with f=about 14 (Speedcure® 7006, provided by Lambson);

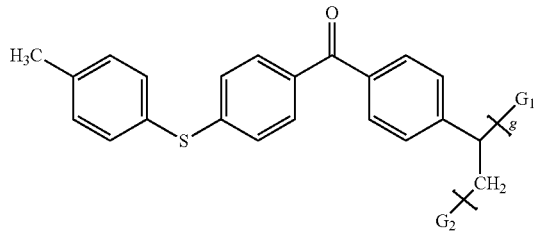

with h=about 13 (Speedcure® 7020, provided by Lambson), and any blends or admixtures of the above mentioned compounds; thioxanthones, thioxanthone derivatives, polymeric thioxanthones as for example OMNIPOL TX; ketal compounds, as for example benzildimethyl-ketal (IRGACURE® 651); acetophenone, acetophenone derivatives, for example α-hydroxy-cycloalkyl phenyl ketones or α-hydroxyalkyl phenyl ketones, such as for example 2-hydroxy-2-methyl-1-phenyl-propanone (DAROCUR® 1173), 1-hydroxy-cyclohexyl-phenyl-ketone (IRGACURE®184), 1-(4-dodecylbenzoyl)-1-hydroxy-1-methyl-ethane, 1-(4-isopropylbenzo-yl)-1-hydroxy-1-methyl-ethane, 1-[4-(2-hydroxyethoxy)-phenyl]-2-hydroxy-2-methyl-1-propan-1-one (IRGACURE®2959); 2-hydroxy-1-{4-[4-(2-hydroxy-2-methyl-propionyl)-benzyl]-phenyl}-2-methyl-propan-1-one (IRGACURE® 127); 2-hydroxy-1-{4-[4-(2-hydroxy-2-methyl-propion-yl)-phenoxy]-phenyl}-2-methyl-propan-1-one; dialkoxyacetophenones, α-hydroxy- or α-aminoacetophenones, e.g. (4-methylthiobenzoyl)-1-methyl-1-morpholinoethane (IRGACURE® 907), (4-morpholinobenzoyl)-1-benzyl-1-dimethylaminopropane (IRGACURE® 369), (4-morpholinobenzoyl)-1-(4-methylbenzyl)-1-dimethylaminopropane (IRGACURE® 379), (4-(2-hydroxyethyl)aminobenzoyl)-1-benzyl-1-dimethylaminopropane), (3,4-dimethoxybenzoyl)-1-benzyl-1-dimethylaminopropane; 4-aroyl-1,3-dioxolanes, benzoin alkyl ethers and benzil ketals, e.g. dimethyl benzil ketal, phenylglyoxalic esters and derivatives thereof, e.g. methyl α-oxo benzeneacetate, oxophenyl-acetic acid 2-(2-hydroxy-ethoxy)-ethyl ester, dimeric phenylglyoxalic esters, e.g. oxo-phenyl-acetic acid 1-methyl-2-[2-(2-oxo-2-phenyl-acetoxy)-propoxy]-ethyl ester (IRGACURE® 754); ketosulfones, e.g. ESACURE KIP 1001 M®; oxime-esters, e.g. 1,2-octanedione 1-[4-(phenylthio)phenyl]-2-(O-benzoyloxime) (IRGACURE® OXE01), ethanone 1-[9-ethyl-6-(2-methylbenzoyl)-9H-carbazol-3-yl]-1-(O-acetyloxime) (IRGACURE® OXE02), 9H-thioxanthene-2-carboxaldehyde 9-oxo-2-(O-acetyloxime), peresters, e.g. benzophenone tetracarboxylic peresters as described for example in EP 126541, monoacyl phosphine oxides, e.g. (2,4,6-trimethylbenzoyl)diphenylphosphine oxide (DAROCUR® TPO), ethyl (2,4,6 trimethylbenzoyl phenyl) phosphinic acid ester; bisacyl-phosphine oxides, e.g. bis(2,6-dimethoxy-benzoyl)-(2,4,4-trimethyl-pentyl)phosphine oxide, bis(2,4,6-trimethylbenzoyl)-phenylphosphine oxide (IRGACURE® 819), bis(2,4,6-trimethyl-benzoyl)-2,4-dipentoxyphenylphosphine oxide, trisacylphosphine oxides, halomethyltriazines, e.g. 2-[2-(4-methoxy-phenyl)-vinyl]-4,6-bis-trichloromethyl-[1,3,5]triazine, 2-(4-methoxy-phenyl)-4,6-bis-trichloromethyl-[1,3,5]triazine, 2-(3,4-dimethoxy-phenyl)-4,6-bis-trichloromethyl-[1,3,5]triazine, 2-methyl-4,6-bis-trichloromethyl-[1,3,5]triazine, hexaarylbisimidazole/coinitiators systems, e.g. ortho-chlorohexaphenyl-bisimidazole combined with 2-mercapto-benzthiazole, ferrocenium compounds, or titanocenes, e.g. bis(cyclopentadienyl)-bis(2,6-difluoro-3-pyrryl-phenyl)titanium (IRGACURE®784). Further, borate compounds can be used as coinitiators. As additional photoinitiators oligomeric compounds such as for example oligomeric alpha hydroxyl ketones e.g. 2-hydroxy-1-{1-[4-(2-hydroxy-2-methyl-propionyl)-phenyl]-1,3,3-trimethyl-indan-5-yl}-2-methyl-propan-1-one, ESACURE KIP® provided by Fratelli Lamberti, or oligomeric alpha amino ketones may be employed as well.

In one embodiment the photoinitiator is benzophenone (DAROCURE® BP), benzildimethylketal (IRGACURE® 651), 1-hydroxy-cyclohexyl-phenyl-ketone (IRGACUR 184), 1-[4-(2-hydroxyethoxy)-phenyl]-2-hydroxy-2-methyl-1-propan-1one (IRGACURE® 2959), 2-hydroxy-1-{4-[4-(2-hydroxy-2-methyl-propionyl)-benzyl]-phenyl}-2-methyl-propan-1-one (IRGACURE®127), (4-methylthio-benzoyl)-1-methyl-1-morpholinoethane (IRGACURE® 907), (4-morpholinobenzoyl)-1-benzyl-1-dimethylaminopropane (IRGACURE® 369), (4-morpholinobenzoyl)-1-(4-methylbenzyl)-1-dimethylaminopropane (IRGACURE® 379), (2,4,6-trimethylbenzoyl)diphenylphosphine oxide (DAROCUR® TPO), bis(2,6-dimethoxy-benzoyl)-(2,4,4-trimethyl-pentyl)phosphine oxide, bis(2,4,6-trimethylbenzoyl)-phenylphosphine oxide (IRGACURE® 819) and 2-hydroxy-1-{1-[4-(2-hydroxy-2-methyl-propionyl)-phenyl]-1,3,3-trimethyl-indan-5-yl}-2-methyl-propan-1-one, (ESACURE ONE®), 1,2-octanedione, 1-[4-(phenylthio) phenyl]-,2-(O-benzyloxime) (IRGACURE OXE01®). (claim 7)

The photoinitiator is preferably 1-hydroxy-cyclohexyl-phenyl-ketone (IIRGACURE® 184), 2-hydroxy-1-{1-[4-(2-hydroxy-2-methyl-propionyl)-phenyl]-1,3,3-trimethyl-indan-5-yl}-2-methyl-propan-1-one, (ESACURE ONE®), bis (2,6-dimethoxy-benzoyl)-(2,4,4-trimethyl-pentyl)-phosphine oxide, bis(2,4,6-trimethylbenzoyl)-phenylphosphine oxide (IRGACURE® 819), 1-[4-(2-hydroxyethoxy)-phenyl]-2-hydroxy-2-methyl-1-propan-1-one (IRGACURE® 2959).

Most preferred are solid alpha hydroxyketones like e.g. IIRGACURE® 184.

Amounts

The photoinitiator is present in an amount of at least 30% by weight, more preferably at least 50% by weight and most preferably at least 65% by weight based on the total blend. (claim 2)

The alkoxylated liquid surface active agent is present in an amount between 1 and 70% by weight, more preferably between 1 and 40% by weight and most preferably between 1 and 20% by weight based on the total blend.

Preparation

The inventive homogeneous liquid blend is obtainable by a process comprising the steps of
heating at least 30% by weight of a photoinitiator to above its melting temperature
adding 1-70% by weight of at least one alkoxylated liquid surface active agent of a liquid surface active agent and optionally adding a diluent
cooling to room temperature to obtain a liquid blend.

Advantages

The inventive free flowing liquid is suitable for aqueous and solvent based systems.

Higher active contents are obtainable as compared to previous solutions like the waterborne dispersions of photoinitiators described in EP386650 (Lamberti) and EP1230276B1 (Ciba) and in GB2014152 (Minesota Mining) In addition the inventive homogenous liquid blends show better storage stability, especially at elevated temperatures, as there are no heterogeneous photoinitiator particles which may irreversibly settle like in the case of a dispersion.

The invention further relates to a photopolymerizable composition comprising
(A) at least one ethylenically unsaturated photopolymerizable compound and
(B) at least a homogenous liquid blend of photoinitiator and surfactant as described above.

The unsaturated compounds may include one or more olefinic double bonds. They may be of low (monomeric) or high (oligomeric) molecular mass. Examples of monomers containing a double bond are alkyl or hydroxyalkyl acrylates or methacrylates, for example methyl, ethyl, butyl, 2-ethylhexyl or 2-hydroxyethyl acrylate, isobornyl acrylate, methyl methacrylate or ethyl methacrylate. Interesting also are resins which are modified with silicon or fluor, e.g. silicon acrylates. Other examples are acrylonitrile, acrylamide, methacrylamide, N-substituted (meth)acrylamides, vinyl esters such as vinyl acetate, vinyl ethers such as isobutyl vinyl ether, styrene, alkyl- and halostyrenes, N-vinylpyrrolidone, vinyl chloride or vinylidene chloride.

Examples of monomers containing two or more double bonds are the diacrylates of ethylene glycol, propylene glycol, neopentyl glycol, hexamethylene glycol or of bisphenol A, and 4,4'-bis(2-acryl-oyloxyethoxy)diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate or tris(2-acryloylethyl) isocyanurate.

Examples of polyunsaturated compounds of relatively high molecular mass (oligomers) are acrylated epoxy resins, acrylated polyesters, polyesters containing vinyl ether or epoxy groups, and also acrylated polyurethanes and poly-ethers. Further examples of unsaturated oligomers are unsaturated polyester resins, which are usually prepared from maleic acid, phthalic acid and one or more diols and have molecular weights of from about 500 to 3000. In addition it is also possible to employ vinyl ether monomers and oligomers, and also maleate-terminated oligomers with polyester, polyurethane, polyether, polyvinyl ether and epoxy main chains.

Particularly suitable examples are esters of ethylenically unsaturated carboxylic acids and polyols or polyepoxides, and polymers having ethylenically unsaturated groups in the chain or in side groups, for example unsaturated polyesters, polyamides and polyurethanes and copolymers thereof, alkyd resins, polybutadiene and butadiene copolymers, polyisoprene and isoprene copolymers, polymers and copolymers containing (meth)acrylic groups in side chains, and also mixtures of one or more such polymers.

Examples of unsaturated carboxylic acids are acrylic acid, methacrylic acid, crotonic acid, itaconic acid, cinnamic acid, and unsaturated fatty acids such as linolenic acid or oleic acid. Acrylic and methacrylic acid are preferred.

Suitable polyols are aromatic and, in particular, aliphatic and cycloaliphatic polyols. Examples of aromatic polyols are hydroquinone, 4,4'-dihydroxydiphenyl, 2,2-di(4-hydroxyphenyl)propane, and also novolaks and resols. Examples of polyepoxides are those based on the abovementioned polyols, especially the aromatic polyols, and epichlorohydrin. Other suitable polyols are polymers and copolymers containing hydroxyl groups in the polymer chain or in side groups, examples being polyvinyl alcohol and copolymers thereof or polyhydroxyalkyl methacrylates or copolymers thereof. Further polyols which are suitable are oligoesters having hydroxyl end groups.

Examples of aliphatic and cycloaliphatic polyols are alkylenediols having preferably 2 to 12 C atoms, such as ethylene glycol, 1,2- or 1,3-propanediol, 1,2-, 1,3- or 1,4-butanediol, pentanediol, hexanediol, octanediol, dodecanediol, diethylene glycol, triethylene glcyol, polyethylene glycols having molecular weights of preferably from 200 to 1500, 1,3-cyclopentanediol, 1,2-, 1,3- or 1,4-cyclohexanediol, 1,4-dihydroxymethylcyclohexane, glycerol, tris(β-hydroxyethyl) amine, trimethylolethane, trimethylolpropane, pentaerythritol, dipentaerythritol and sorbitol.

The polyols may be partially or completely esterified with one carboxylic acid or with different unsaturated carboxylic acids, and in partial esters the free hydroxyl groups may be modified, for example etherified or esterified with other carboxylic acids.

Examples of esters are:
trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol tris-itaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetra methacrylate, sorbitol pentaacrylate, sorbitol hexaacrylate, oligoester acrylates and methacrylates, glycerol diacrylate and triacrylate, 1,4-cyclohexane diacrylate, bisacrylates and bismethacrylates of polyethylene glycol with a molecular weight of from 200 to 1500, or mixtures thereof.

Use

The homogeneous liquid blend as defined above is used to produce solvent-free, solvent- or water-based surface coatings, printing inks, screen-printing inks, offset-printing inks, flexographic-printing inks, resist materials or image-recording material, especially in the production of corresponding aqueous systems.

EXAMPLES AND APPLICATION RESULTS

Liquid photoinitiator product forms of the following photoinitiators were prepared:

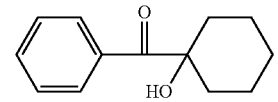

IRGACUR® 184

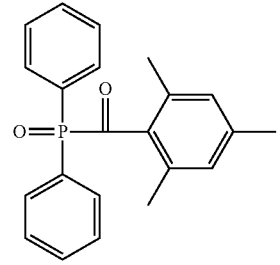

DAROCURE® TPO

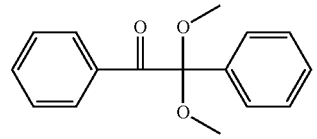

IRGACURE® 651

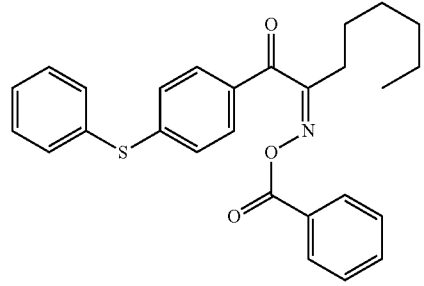

IRGACURE® OXE 01

ESACURE® ONE Difunctional Alpha Hydroxyketone, available from Lamberti

ESACURE KIP 150® Oligomeric polyfunctional alpha-hydroxyketone, available from Lamberti.

Example 1

75 g of 1-hydroxy-cyclohexyl-phenyl-ketone (IRGACURE 184) with a purity>90% is molten in a reactor at 60° C. 10 g of Hedipin R/200 (PEG-20 Castor oil) is added, 15 g of tetraethylene glycol is added and the mixture is stirred at 60° C. until homogeneous. The mixture is cooled slowly to room temperature. The product form is a clear, colorless to yellow liquid.

Example 2

75 g of 1-hydroxy-cyclohexyl-phenyl-ketone (IRGACURE 184) with a purity>90% is molten in a reactor at 60° C. 10 g of Hedipin R/200 (PEG-20 Castor oil) is added, 15 g of poly(ethylene glycol) 350 monomethyl ether is added and the mixture is stirred at 60° C. until homogeneous. The mixture is cooled slowly to room temperature. The product form is a clear, colorless to yellow liquid.

Example 3

70 g of 1-hydroxy-cyclohexyl-phenyl-ketone (IRGACURE 184) with a purity >90% is molten in a reactor at 60° C. 8 g of Tween 80 (poly(ethylene glycol) sorbitan monooleate) and 2 g of Span 80 (sorbitan monooleate) is added, 20 g poly(ethylene glycol) 350 monomethyl ether is added and the mixture is stirred at 60° C. until homogeneous. The mixture is cooled slowly to room temperature. The product form is a clear, colorless to yellow liquid.

Example 4

90 g of 1-hydroxy-cyclohexyl-phenyl-ketone (IRGACURE 184) with a purity>90% is molten in a reactor at 60° C. 10 g of Brij 30 (tetraethylene glycol dodecyl ether) is added and the mixture is stirred at 60° C. until homogeneous. The mixture is cooled slowly to room temperature. The product form is a clear, colorless to yellow liquid.

Example 5

31 g of 2,4,6-trimethylbenzoyl-diphenyl-phosphineoxide (DAROCURE TPO) is mixed with 10 g of Hedipin R/200 (PEG-20 Castor oil) and 59 g of poly(ethylene glycol) 350 monomethyl ether. The mixture is stirred in a reactor at 90° C. until homogeneous. The mixture is cooled slowly to room temperature. The product form is a clear yellowish liquid.

Example 6

50 g of 1,2-octanedione, 1-[4-(phenylthio)phenyl]-,2-(O-benzyloxime) (IRGACURE OXE01) is mixed with 10 g of Hedipin R/200 (PEG-20 Castor oil) and 40 g of poly(ethylene glycol) 350 monomethyl ether. The mixture is stirred in a reactor at 60° C. until homogeneous. The mixture is cooled slowly to room temperature. The product form is a clear yellowish liquid.

Example 7

31 g of 2,2-Dimethoxy-1,2-diphenylethan-1-one (IRGACURE 651) is mixed with 10 g of Hedipin R/200 (PEG-20 Castor oil) and 59 g of poly(ethylene glycol) 350 monomethyl ether. The mixture is stirred in a reactor at 70° C. until homogeneous. The mixture is cooled slowly to room temperature. The product form is a clear yellowish liquid.

Example 8

70 g of 2-hydroxy-1-{1-[4-(2-hydroxy-2-methyl-propionyl)-phenyl]-1,3,3-trimethyl-indan-5-yl}-2-methyl-propan-1-one (Esacure ONE) is mixed with 8 g of Tween 80 (poly (ethylene glycol)sorbitan monooleate), 2 g of Span 80 (sorbitan monooleate) and 20 g of tetraethylene glycol The mixture is heated to 115° C. and stirred until homogeneous. The mixture is cooled slowly to room temperature. The product form is a clear, colorless to yellow viscous liquid.

Application Results

In the following the photoinitiator refers to its inventive liquid blend delivery form, not to the active content.

1. UV-Curing of Clear Epoxy-Acrylate Coatings

A UV-curable paint is prepared using the following formulation:

| % by weight | Component | Description | Supplier |
|---|---|---|---|
| 89.0 | Ebecryl 604 | Unsaturated epoxy-acrylate approx. 80% in HDDA | Cytec Surface Specialties |
| 10.0 | SR 344 | Polyethylene Glycol (400) Diacrylate | Sartomer |
| 1.0 | Ebecryl 350 | Unsaturated silicone acrylate | Cytec Surface Specialties |

Samples were prepared using above formulation and dissolving 2% by wt of a photoinitiator (delivery form) into the above paint. For that, the samples were stirred at a temperature of 50° C. for 60 min.

Samples were applied onto white pre-coated aluminium panels using a wire-wound draw down bar with WFT 60 μm. The samples were cured on an IST laboratory UV-curing equipment using one Hg bulb at 100 W/cm and a line speed of 10 m/min.

The extend of curing was followed by measurement of acrylate double bond conversion (DBC) against the resin itself as reference using AT-IR spectroscopy of the coating surface.

The acrylate peak at approx. 1425 cm$^{-1}$ was normalized using the CH-bond at approx. 2900 cm$^{-1}$. In addition pendulum hardness according to Koenig was measured on all panels.

Curing Results:

|  | ICU 184 | Ex 1 | Ex 2 | Ex 3 | Ex 4 |
|---|---|---|---|---|---|
| active content (%) | 100 | 75 | 75 | 70 | 90 |
| DBC [%] | 79 | 74 | 73 | 70 | 76 |
| PH [s] | 133 | 128.8 | 128.3 | 127 | 127 |

These curing results demonstrate that the inventive liquid photoinitiator blends provide good curing performance in a typical 100% UV system, with double bond conversion and pendulum hardness similar to a state of the art photoinitiator ICU 184 which is not diluted by blend components.

Goal here is to show that the liquid blend gives a good performance in 100% system (advantage would be the liquid product form).

A further advantage is shown for the aqueous systems

2. UV-Curing of Clear Polyester-Acrylate Coatings

A UV-curable paint is prepared using the following formulation:

| % by weight | Component | Description | Supplier |
|---|---|---|---|
| 67.0 | Ebecryl 830 | hexafunctional polyester-acrylate | Cytec Surface Specialties |
| 16.5 | HDDA | Hexandiol Diacrylate, reactive diluent |  |

-continued

| % by weight | Component | Description | Supplier |
|---|---|---|---|
| 16.5 | TMPTA | Trimethylolpropane Triacrylate, reactive diluent | |

Samples were prepared using above formulation and dissolving 6% by wt of a photoinitiator preparation into the above paint. For that, the samples were stirred at a temperature of 50° C. for 60 min.

Samples were applied onto white pre-coated aluminium panels using a wire-wound draw down bar with WFT 60 µm. The samples were cured on an IST laboratory UV-curing equipment using two Hg bulbs at 100 W/cm and a line speed of 10 m/min.

The extend of curing was followed by measurement of acrylate double bond conversion (DBC) against the resin itself as reference using AT-IR spectroscopy of the coating surface. The acrylate peak at approx. 1425 cm$^{-1}$ was normalized using the CH-bond at approx. 2900 cm$^{-1}$. In addition pendulum hardness according to Koenig was measured on all panels.

Curing Results

| | ICU 184 | Ex 1 | Ex 2 | Ex 3 | Ex 4 |
|---|---|---|---|---|---|
| active content (%) | 100 | 75 | 75 | 70 | 90 |
| DBC [%] | 80 | 72 | 72 | 70 | 74 |
| PH [s] | 139 | 135 | 135 | 130 | 136 |

Again the curing results demonstrate that the liquid photoinitiator blends provide useful good curing performance despite the dilution with blend components.

3. Incorporation in w/b Clear UV-Curable Formulation

The following water-based formulation was prepared (WB-Formulation 1):

| % by weight | Product | Description | Supplier |
|---|---|---|---|
| 99.3 | Bayhydrol UV 2282 | UV-curable Polyurethane dispersion in water | Bayer Material Science |
| 0.30 | Borchigel L 75N | Polyurethane thickener, approx. 50% in water | OMG Borchers GmbH |
| 0.40 | Byk 347 | Silicone surfactant for aqueous systems | Byk Additives and Instruments |

0.4 g photoinitiator (delivery form) were placed into a 100 ml glass bottle. 40 g of above water-based formulation was added. The combination was stirred using a magnetic stirring bar for 5 min at approx. 500 rpm. Immediately after mixing, the coating samples were applied over black pre-coated steel panel using a wire-wound draw down bar with wet film thickness of 120 µm.

The films were dried for 30 min at 30° C. and then were cured on an IST laboratory UV-curing equipment using two Hg bulbs at 100 W/cm and a line speed of 10 m/min.

The films were evaluated visually for particles or smear traces of poorly incorporated photoinitiator.

| Photoinitiator | Visual evaluation after application (wet film) | Visual evaluation after curing |
|---|---|---|
| Irgacure 184 | Undissolved particles | Undissolved particles |
| Example 1 | Good | Good |
| Example 3 | Good | Good |

These results show that the inventive photoinitiator blends can be easily incorporated into a waterborne UV-formulation without giving defects to the paint film. This is in contrast to the reference Irgacure 184, which due to the incompatibility does not give a useful waterborne UV-paint. Thus the inventive photoinitiator blends have a much broader applicability ranging from typical non-aqueous UV-paints up to aqueous UV-systems.

4. Curing of w/b Clear UV-Curable Formulation

The photoinitiator samples were tested in 2 different water-based clear coat formulations.
WB-Formulation 1: as described above
WB-Formulation 2:

| % by weight | Product | Description | Supplier |
|---|---|---|---|
| 98.1 | Alberdingk LUX 399 | UV-curable aliphatic polyurethane copolymer | Alberdingk Boley |
| 0.5 | Byk 024 | Defoamer for aqueous systems | Byk Additives and Instruments |
| 0.3 | Byk 333 | Silicone based surface additive | |
| 0.3 | Byk 348 | Silicone surfactant for aqueous systems | |
| 0.8 | Acrysol RM 825 | Non-ionic thickner for aqueous systems | Rohm and Haas |

30 g Formulation was prepared containing 1% by weight photoinitiator (delivery form). The formulation was placed into a glass bottle and photoinitiator was added during stirring with toothed disk at 1500 rpm. The formulations were stirred for a total of 15 min. Samples were applied over white pre-coated aluminium panel using a wire-wound draw down bar with wet film thickness of 120 µm.

Water was evaporated in a convection oven at 60° C. for 10 min. The film was cured on an IST laboratory UV-curing equipment using two Hg bulbs at 100 W/cm and a line speed of 10 m/min. After cooling, the pendulum hardness according to Koenig was measured. For reference, a photoinitiator free sample of the formulations was treated in the same way.

Curing Results WB-Formulation 1:

| Photoinitiator | Pendulum Hardness [s] |
|---|---|
| No photoinitiator | 21 |
| Example 1 | 106 |
| Example 2 | 111 |

Curing Results WB-Formulation 2:

| Photoinitiator | Pendulum Hardness [s] |
|---|---|
| No photoinitiator | Not determined, sticky surface |
| Example 4 | 112 |
| Example 3 | 111 |

These results show that the inventive liquid photoinitiator blends in addition to conventional non-aqueous UV systems, also give good curing performance in waterborne UV-paints.

Example 9

70 g of ESACURE KIP 150 is heated to 70° C. 10 g of Hedipin R/200 (PEG-20 Castor oil) and 20 g of tetraethylene glycol are added and the mixture is stirred at 70° C. until homogeneous. The homogeneous mixture is cooled slowly to room temperature. The product form is a clear yellowish liquid.

Application Results

The application properties of example 9 were assessed in an overprint varnish (OPV). Example 9 was tested against Esacure KIP 150 in its pure form. Assessed were handling, incorporation, curing efficiency and yellowing (visual).

Testing System

| OPV with aminoacrylate | Weight [g] |
|---|---|
| Ebecryl 605 (Bisphenol A epoxyacrylate diluted with 25% of TPGDA) | 30.0 |
| Ebecryl 7100 (amine modified acrylate) | 10.0 |
| Ebecryl 40 (propoxylated/ethoxylated pentaerythritol tetraacrylate) | 5.0 |
| OTA 480 (propoxylated glycerol triacrylate) | 30.0 |
| TPGDA (tripropyleneglycol diacrylate) | 24.0 |
| Ebecryl 1360 (silicone hexaacrylate) | 0.5 |
| Dow Corning 57 (silicone additive) | 0.5 |
| Σ | 100.0 |

Handling

Esacure KIP 150 had to be extracted with a hammer and was dissolved for 1 hour at 45° C. in the OPV. By contrast, Example 9 had a viscosity similar to honey and could be directly poured into the OPV.

Curing Efficiency

Both KIP 150 and Example 9 were tested at 3% active. Cure speeds were compared on cardboard and coilcoat.

TABLE 1

Cold mirror IST, 1% $O_2$, cardboard, bar #1 (6 μm), 80 W/cm, Hg lamp. DRR test

| Formulation | Substrate | % | m/min | $KMnO_4$ OD |
|---|---|---|---|---|
| Esacure KIP 150 | Cardboard | 3 | 90-100 | 0.309 |
| Example 9 | | 4.29 | 100 | 0.301 |
| Esacure KIP 150 | Coilcoat | 3 | 110 | 0.373 |
| Example 9 | | 4.29 | 120 | 0.341 |

Table 1 shows that the reactivity of Example 9 is comparable to Esacure KIP 150 in the pure product form.

Visually, no difference in yellowing could be observed.

These application results show that the liquid product form provides clear processing advantages (handling and incorporation), without compromising curing efficiency.

The invention claimed is:

1. A homogenous liquid blend which is liquid at room temperature comprising:
   at least 65% by weight with regard to the whole blend of a solid photoinitiator of the radical type and
   1-70% by weight of at least one alkoxylated liquid surface active agent and
   optionally an organic diluent.

2. A homogenous liquid blend according to claim 1 wherein the surface active agent is selected from alkoxylated compounds based on adducts with ethylene oxide and/or propylene oxide.

3. A homogenous liquid blend according to claim 1 wherein the surface active agent is selected from alcohol alkoxylates (glycolethers), fatty acid alkoxylates, fatty amine alkoxylates, or fatty amide alkoxylates, alkoxylates of phenols or alkylsubstituted phenols, block copolymers or random copolymers of ethylene oxide and propylene oxide, alkoxylates of alkine-alcohols or alkine-diols, alkoxylates of castor oil, alkoxylates of sorbitan fatty acid esters and mixtures thereof.

4. A homogenous liquid blend according to claim 1 wherein the diluent is present.

5. A homogenous liquid blend according to claim 1 wherein the photoinitiator is selected from benzophenones, aromatic α-hydroxyketones, benzilketals, aromatic α-aminoketones, phenylglyoxalic acid esters, mono-acylphosphinoxides, bis-acylphosphinoxides, tris-acylphosphinoxides and oximesters derived from aromatic ketones.

6. A homogenous liquid blend according to claim 1 wherein the photoinitiator is selected from benzophenone, benzildimethylketal, 1-hydroxy-cyclohexyl-phenyl-ketone, 1-[4-(2-hydroxyethoxy)-phenyl]-2-hydroxy-2-methyl-1-propan-1one, 2-hydroxy-1-{4-[4-(2-hydroxy-2-methyl-propionyl)-benzyl]-phenyl}-2-methyl-propan-1-one, (4-methylthiobenzoyl)-1-methyl-1-morpholinoethane, (4-morpholinobenzoyl)-1-benzyl-1-dimethylaminopropane, (4-morpholinobenzoyl)-1-(4-methylbenzyl)-1-dimethylaminopropane, (2,4,6-trimethylbenzoyl)diphenylphosphine oxide, bis(2,6-dimethoxy-benzoyl)-(2,4,4-trimethyl-pentyl) phosphine oxide, bis(2,4,6-trimethylbenzoyl)-phenylphosphine oxide and 2-hydroxy-1-{1-[4-(2-hydroxy-2-methyl-propionyl)-phenyl]-1,3,3-trimethyl-indan-5-yl}-2-methyl-propan-1-one, 1,2-octanedione, 1-[4-(phenylthio)phenyl]-,2-(O-benzyloxime).

7. A homogenous liquid blend according to claim 6 wherein the photoinitiator is selected from 1-hydroxy-cyclohexyl-phenyl-ketone, 2-hydroxy-1-{1-[4-(2-hydroxy-2-methylpropionyl)-phenyl]-1,3,3-trimethyl-indan-5-yl}-2-methyl-propan-1-one, bis(2,6-dimethoxy-benzoyl)-(2,4,4-trimethyl-pentyl)phosphine oxide, bis(2,4,6-trimethylbenzoyl)-phenylphosphine oxide, 1-[4-(2-hydroxyethoxy)-phenyl]-2-hydroxy-2-methyl-1-propan-1-one.

8. A process for the preparation of a homogenous liquid blend as defined in claim 1 comprising the steps of
   heating at least 65% by weight of a photoinitiator to a temperature above its melting point
   adding 1-70% by weight of at least one alkoxylated liquid surface active agent and optionally adding a diluent
   cooling to room temperature to obtain a homogeneous liquid blend.

9. A photopolymerisable composition comprising
   (A) at least one ethylenically unsaturated photopolymerisable compound and
   (B) at least a homogenous liquid blend according to claim 1.

10. The use of a homogeneous liquid blend according to claim 1 in the production of solvent-free, solvent- and water-based surface coatings, printing inks, screen-printing inks, offset-printing inks, flexographic-printing inks, resist materials or image-recording material.

* * * * *